United States Patent
Chung et al.

(10) Patent No.: US 6,950,488 B2
(45) Date of Patent: Sep. 27, 2005

(54) DELAY LOCKED-LOOP CIRCUIT FOR REDUCING LOAD OF VARIABLE DELAY UNIT AT HIGH-FREQUENCY OPERATION AND LOCKING EXTERNAL CLOCK SIGNAL STABLY

(75) Inventors: Dae-hyun Chung, Yongin (KR); Ho-young Song, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 757 days.

(21) Appl. No.: 09/945,599

(22) Filed: Sep. 4, 2001

(65) Prior Publication Data

US 2002/0027967 A1 Mar. 7, 2002

(30) Foreign Application Priority Data

Sep. 5, 2000 (KR) .......................................... 2000-52376
Jul. 24, 2001 (KR) ..................................... 10-2001-44591

(51) Int. Cl.[7] .............................................. H04L 7/033
(52) U.S. Cl. ........................................... 375/376; 331/25
(58) Field of Search ................................. 375/376, 373; 327/158, 156, 149; 331/25

(56) References Cited

U.S. PATENT DOCUMENTS 5,604,775 A * 2/1997 Saitoh et al. ................ 375/376

* cited by examiner

Primary Examiner—Stephen Chin
Assistant Examiner—Jaison Joseph
(74) Attorney, Agent, or Firm—F. Chau & Associates, LLC

(57) ABSTRACT

Disclosed is a delay locked-loop circuit comprising a phase detector for detecting a phase difference between an external clock signal and an internal clock signal, a delay unit controller for generating a control signal in response to output of the phase detector, and a variable delay unit for delaying the external clock in response to the control signal to synchronize the internal clock with the external clock, the variable delay unit comprising a first group of delay cells used at or above a predetermined frequency, a second group of delay cells used with the first group of delay cells at or below a predetermined frequency, switch transistors for connecting/disconnecting the first group of delay cells and the second group of delay cells to/from a first output line and a second output line of the variable delay unit, respectively, in response to the control signal, and a switch for connecting/disconnecting the first output line to/from the second output line in response to a delay use signal representing the use of one of the delay cells in the first group.

18 Claims, 9 Drawing Sheets

DELAY LOCKED-LOOP CIRCUIT FOR REDUCING LOAD OF VARIABLE DELAY UNIT AT HIGH-FREQUENCY OPERATION AND LOCKING EXTERNAL CLOCK SIGNAL STABLY

CROSS REFERENCE TO RELATED APPLICATIONS

This application claims the benefit, under 35 U.S.C. §119, of Korean Patent Application No. 2000-52376, filed on Sep. 5, 2000, and Korean Patent Application No. 2001-0044591, filed Jul. 24, 2001, the disclosures of both of which are incorporated by reference herein in their entirety.

BACKGROUND OF THE INVENTION

1. Field of the Invention

The invention relates to a semiconductor integrated circuit, and more particularly, to a delay locked-loop circuit for reducing the load of a variable delay unit at high frequency operation and stably locking an external clock signal.

2. Description of the Related Art

Synchronous DRAMs synchronize with a clock signal to input and output data to and from memory cells. The clock signal is typically input via a single input pin and then distributed to the synchronous DRAMs. A clock signal reaching a point relatively far from the input pin may be considerably delayed compared to a clock signal reaching a point adjacent to the input pin. This delay disrupts the synchronization of each component in a synchronous DRAM.

Delay locked-loop circuits are typically used to maintain synchronization and generate an internal clock signal synchronized with an external clock signal. A delay locked-loop circuit operates at almost the same speed as the operation speed of a synchronous DRAM. A delay locked-loop circuit must operate at or above a predetermined frequency (hereinafter, referred to as high-frequency operation) and at or below the predetermined frequency (hereinafter, referred to as low-frequency operation).

FIG. 1 shows a typical delay locked-loop circuit. A delay locked-loop circuit 100 comprises a phase detector 110, a delay unit controller 120, and a variable delay unit 130. The phase detector 110 detects a phase difference between an external clock signal ECLK and an internal clock signal ICLK. The delay unit controller 120 generates a control signal CNT that controls the delay time of the external clock signal ECLK input into the variable delay unit 130 in response to output of the phase detector 110. The variable delay unit 130 generates an internal clock signal ICLK that is synchronized with the external clock signal ECLK in response to the control signal CNT.

FIG. 2 shows the variable delay unit 130 shown in FIG. 1. The variable delay unit 130 comprises delay cells 201 through 208 and switch transistors 211 through 218. The delay cells 201 through 208 are each connected to one of the switch transistors 211 through 218, which are connected to an output line OL1 of the variable delay unit 130. The delay cells 201 through 208 delay the external clock signal ECLK.

The number of the delay cells 201 through 208 depends on the operation frequency of the delay locked-loop circuit 100. The number of delay cells 201 through 208 for high-frequency operation will be less than that for low-frequency operation. In the case of low-frequency operation, the switch transistors 211 through 218 are all turned on in response to the control signal CNT to connect the delay cells 201 through 208 to the output line OL1. Thus, the load of the output line OL1 is high. In the case of high-frequency operation, transistors 215 through 218 are not turned on and delay cells 205 through 208 do not affect the output line OL1, therefore the load of the output line OL1 is small.

The variable delay unit 130 has a line load proportional to the physical length of the output line OL1 and a junction load due to the switch transistors 211 through 218, which are turned off, even if the delay cells 205 through 208 are not connected to the output line OL1 for high-frequency operation. Thus, the variable delay unit 130 is inappropriate in the case of high-frequency operation. As a result, jitter is apparent in the internal clock signal ICLK that is generated in the delay locked-loop circuit 100 shown in FIG. 1 and a duty ratio becomes degraded. Thus, the synchronous DRAM does not operate properly.

SUMMARY OF THE INVENTION

Disclosed is a delay locked-loop circuit comprising a phase detector for detecting a phase difference between an external clock signal and an internal clock signal, a delay unit controller for generating a control signal in response to output of the phase detector, and a variable delay unit for delaying the external clock in response to the control signal to synchronize the internal clock with the external clock, the variable delay unit comprising a first group of delay cells used at or above a predetermined frequency, a second group of delay cells used with the first group of delay cells at or below a predetermined frequency, switch transistors for connecting/disconnecting the first group of delay cells and the second group of delay cells to/from a first output line and a second output line of the variable delay unit, respectively, in response to the control signal, and a switch for connecting/disconnecting the first output line to/from the second output line in response to a delay use signal representing the use of one of the delay cells in the first group.

In another aspect of the invention, the delay use signal is a signal representing the use of a delay cell that is disposed immediately before the switch.

In another aspect of the invention, the delay use signal is a signal representing either the use of a delay cell disposed immediately before the switch or one of the remaining delay cells from the first group of delay cells.

Disclosed is a delay locked-loop circuit comprising a phase detector for detecting a phase difference between an external clock and an internal clock, a delay unit controller for generating a control signal in response to output of the phase detector, and a variable delay unit for delaying the external clock in response to the control signal to synchronize the internal clock with the external clock, the variable delay unit comprising a first group of delay cells used at or above a predetermined frequency, a second group of delay cells used with the first group of delay cells at or below a predetermined frequency, switch transistors for connecting/disconnecting the first group of delay cells and the second group of delay cells to/from a first output line and a second output line of the variable delay unit, respectively, in response to the control signal, a switch for connecting/disconnecting the first output line to/from the second output line, and a control circuit for controlling the turn-on/turn-off of the switch in response to a delay use signal representing the use of one of the delay cells in the first group and a reset signal.

In another aspect of the invention, the variable delay unit further comprises a reset circuit for generating the reset signal in response to an external reset command, an UP signal representing an increase in the number of the delay cells used, or a DOWN signal representing a decrease in the number of the delay cells used.

In another aspect of the invention, the variable delay unit further comprises a precharging circuit for precharging the second output line to a predetermined voltage level in response to a precharging signal output from the control circuit.

In another aspect of the invention, the control circuit comprises a latch unit for setting an output terminal in response to the delay use signal and reset the output terminal in response to the reset signal, and a buffer for generating a switch control signal to control the switch.

In another aspect of the invention, the reset circuit comprises an UP signal detecting circuit for counting the number of consecutive UP signals and to activate output of the reset circuit if the counted number of consecutive UP signals is at or above a predetermined value, a DOWN signal detecting circuit for counting the number of consecutive DOWN signals and activate output of the reset circuit if the counted number of consecutive DOWN signals is at or above a predetermined value, and an OR circuit for generating the reset signal in response to the external reset command, output of the UP signal detecting circuit, or output of the DOWN signal detecting circuit.

In another aspect of the invention, the UP signal detecting circuit and the DOWN signal detecting circuit each comprise a counter.

In another aspect of the invention, the precharging circuit comprises a PMOS transistor.

In another aspect of the invention, the switch comprises a PMOS transistor.

Disclosed is a delay locked-loop circuit comprising a phase detector for detecting a phase difference between an external clock and an internal clock, a delay unit controller for generating a control signal in response to output of the phase detector, and a variable delay unit for delaying the external clock in response to the control signal to synchronize the internal clock with the external clock, the variable delay unit comprising a first group of delay cells used at or above a predetermined frequency, a second group of delay cells used with the first group of delay cells at or below a predetermined frequency, switch transistors for connecting/disconnecting the first group of delay cells and the second group of delay cells to/from a first output line and a second output line of the variable delay unit, respectively, in response to the control signal, a switch for connecting/disconnecting the first output line to/from the second output line, and a control circuit for controlling the turn-on/turn-off of the switch in response to delay variation signals representing variations in the number of delay cells used.

In another aspect of the invention, the variable delay unit further comprises a precharging circuit for precharging the second output line to a predetermined voltage level in response to a precharging signal output from the control circuit.

In another aspect of the invention, the control circuit comprises a delay detection circuit for generating a variable voltage in response to an UP signal of the delay variation signals representing an increase in the number of the delay cells used, and in response to a DOWN signal of the delay variation signals representing a decrease in the number of the delay cells used, a Schmitt trigger buffer for outputting the variable voltage as a first voltage if the variable voltage is at or above a first voltage level and as ground voltage if the variable voltage is at or below a second voltage, so as to generate the precharging signal, and an inverter for inverting the precharging signal to generate a switch control signal to control the switch.

In another aspect of the invention, the precharging circuit comprises a PMOS transistor.

In another aspect of the invention, the delay detection circuit comprises a charge pump.

In another aspect of the invention, the switch comprises a PMOS transistor.

Disclosed is a delay locked-loop circuit comprising a phase detector for detecting a phase difference between an external clock signal and an internal clock signal, a delay controller for generating a control signal in response to output of the phase detector, and a variable delay for delaying the external clock in response to the control signal to synchronize the internal clock with the external clock, the variable delay having a first and second output lines, and means for connecting/disconnecting a first group of delay cells used at or above a predetermined frequency and a second group of delay cells used at or below a predetermined frequency to/from the first output line and the second output line, respectively, in response to the control signal.

In another aspect of the invention, there is also provided a second switch means for connecting/disconnecting the first output line to/from the second output line in response to a delay use signal representing the use of one of the delay cell means in the first group.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

Figure 1:
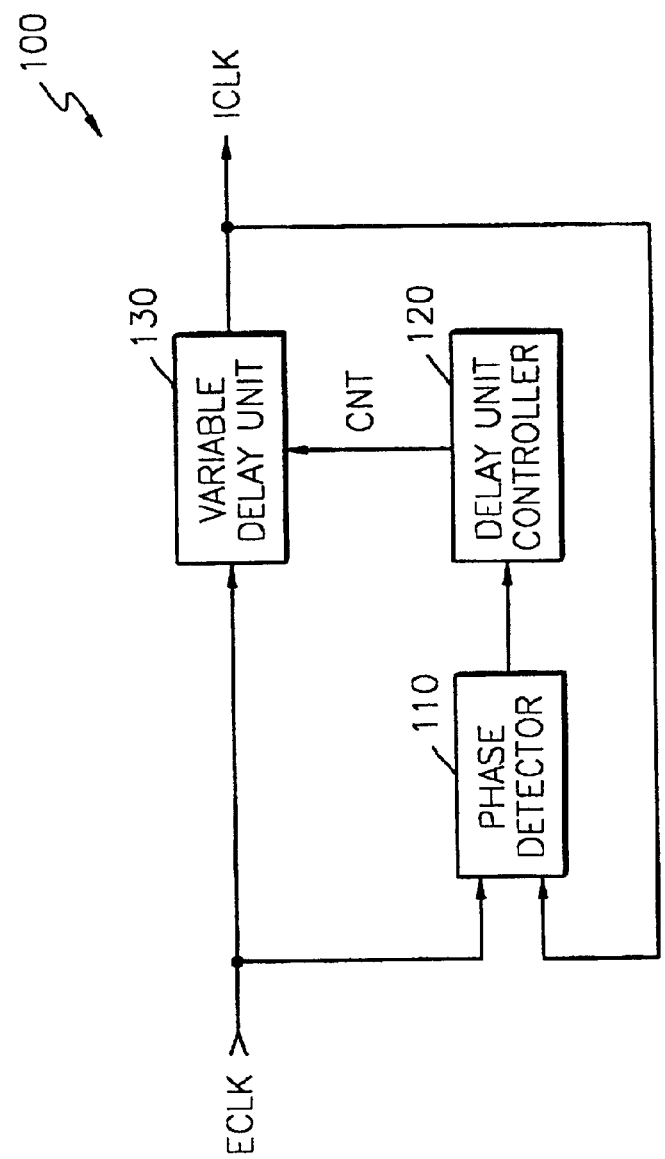
FIG. 1 is a block diagram of a typical delay locked-loop circuit.
Figure 2:
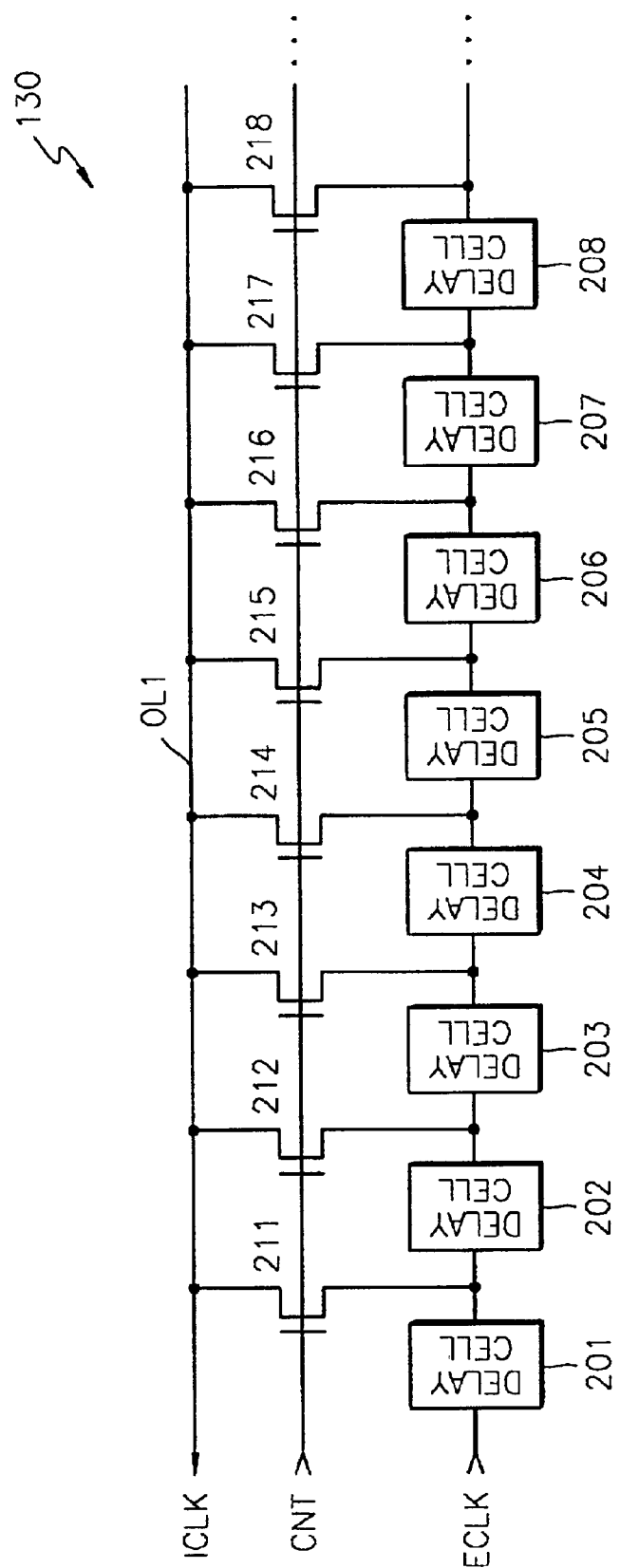
FIG. 2 is a block diagram of a variable delay unit shown in FIG. 1.

Hereinafter, the present invention will be described in detail by explaining preferred embodiments of the present invention with reference to the attached drawings. Like reference numerals in the drawings denote the same members.

Figure 3:
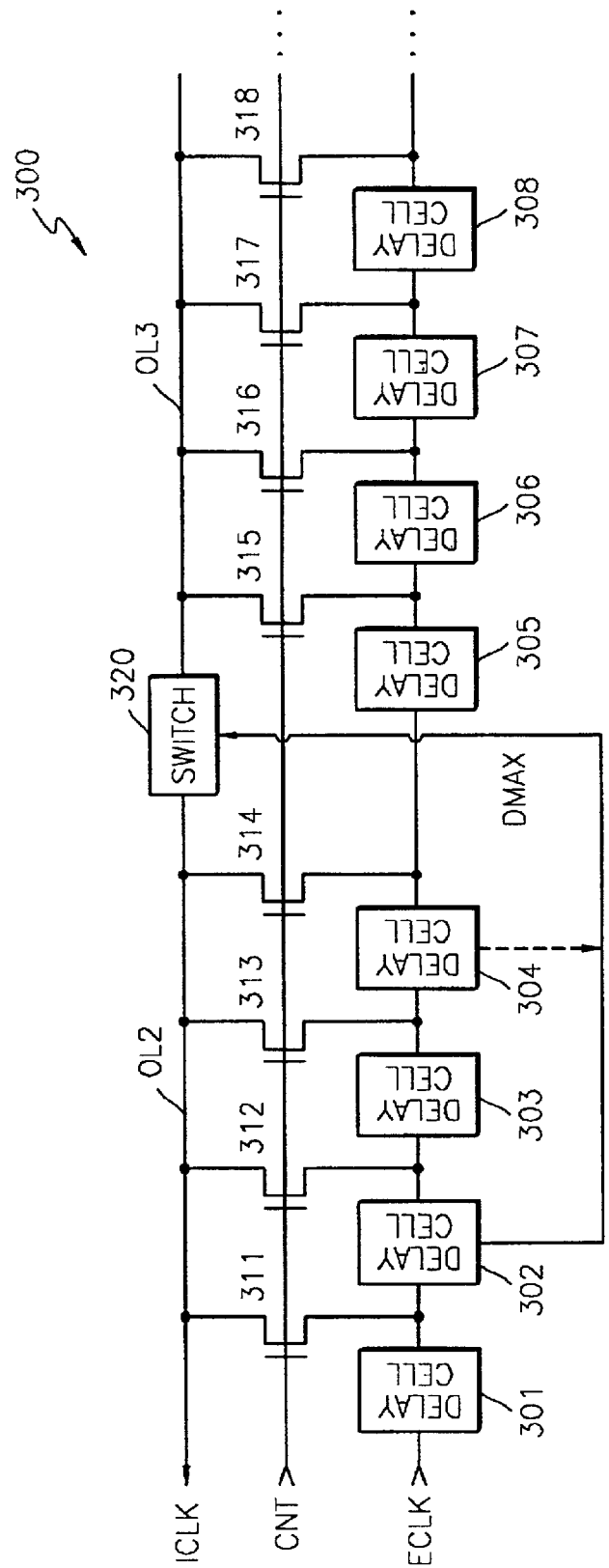
FIG. 3 is a block diagram of a variable delay unit according to an embodiment of the invention.

Referring to FIG. 3, there is shown a variable delay unit according to an embodiment of the invention, wherein a variable delay unit 300 is substituted for the variable delay unit 130 of the prior art delay locked-loop 100 shown in FIG. 1. The phase detector 110 and the delay unit controller 120 are components of a delay locked-loop circuit of the invention. The variable delay unit 300 comprises a first group of delay cells 301 through 304, a second group of delay cells 305 through 308, switch transistors 311 through 318, and a switch 320. The switch 320 of the variable delay unit 300 is not comprised in the variable delay unit 130 shown in FIG. 1.

In the case of high-frequency operation, a first output line OL2 is used, and in the case of low-frequency operation, the first output line OL2 and a second output line OL3 are used.

The first group of delay cells 301 through 304 are used for high-frequency operation, and the second group of delay cells 305 through 308 are used for low-frequency operation together with the first group of delay cells 301 through 304. The switch transistors 311 through 318 each transmit an external clock ECLK, which is delayed, to the first and second output lines OL2 and OL3 in response to the control signal CNT generated in the delay unit controller 120 (shown in FIG. 1).

The delay unit controller 120, in conjunction with the phase detector 110, of FIG. 1 function to time the activation and deactivation of the control signal CNT such that fewer delay cells are activated as the clock signal ECLK passes through at high frequencies than at lower frequencies. For example, at the highest frequencies, only delay cell 301 may be activated (i.e., connected to OL2 of FIG. 3) as a clock signal passes through while the remaining delay cells will be deactivated (i.e., cut off from OL2 and OL3) by the time the delayed clock signal reaches them. As the frequency drops, an increasing number of delay cells are activated, proceeding from delay cell 301 toward 308 until, at the lowest frequencies, all the delay cells remain active for the duration of a clock signal.

The switch 320 is disposed between the first and second output lines OL2 and OL3. The switch 320 is controlled by a delay cell that is positioned right before the switch 320, i.e., the delay cell 304. The delay cell 304 is the last delay cell in the first group of delay cells, which are used for high- and low-frequency operation. A delay use signal DMAX denotes low-frequency operation. If the switch 320 is turned on to enable low-frequency operation, the load of the first and second output lines OL2 and OL3 is increased.

The switch 320 may be controlled by the delay use signal DMAX output from a delay cell that is positioned before the switch 320. This embodiment has the switch 320 controlled by the delay use signal DMAX representing the use of a delay cell 302. Power supply voltage and temperature may vary depending on the operation of a semiconductor memory device when high-frequency operation is performed, thereby requiring more delay cells to be connected to the first output line OL2. Delay cells 303 and 304 after the delay cell 302 are comprised to satisfy this need.

The second output line OL3, to which the switch transistors 315 through 318 are connected, is disconnected from the first output line OL2 during high-frequency operation and thus, the load of the first output line OL2 is decreased. This results in stable operation at high-frequencies.

When the delay locked-loop circuit according to an embodiment of the invention performs low-frequency operation using the first group of delay cells 301 through 304 and the delay cell 305 of the second group of delay cells 305 through 308, variations in voltage and temperature caused by noise may increase the delay time of the delay cells. Then, the last delay cell 304 of the first group repeatedly turns on and off and thus, the switch 320 is repeatedly switched on and off, thereby increasing the discontinuity of the switch 320. As a result, jitter occurs at the output line of the variable delay unit 300, and noise immunity decreases.

A delay locked-loop circuit for preventing the discontinuity of the switch 320 according to another embodiment of the invention will be described. The delay locked-loop circuit maintains the "on" state of the switch 320 when the switch 320 is turned on, and the switch 320 is turned off by only a reset signal.

Figure 4:
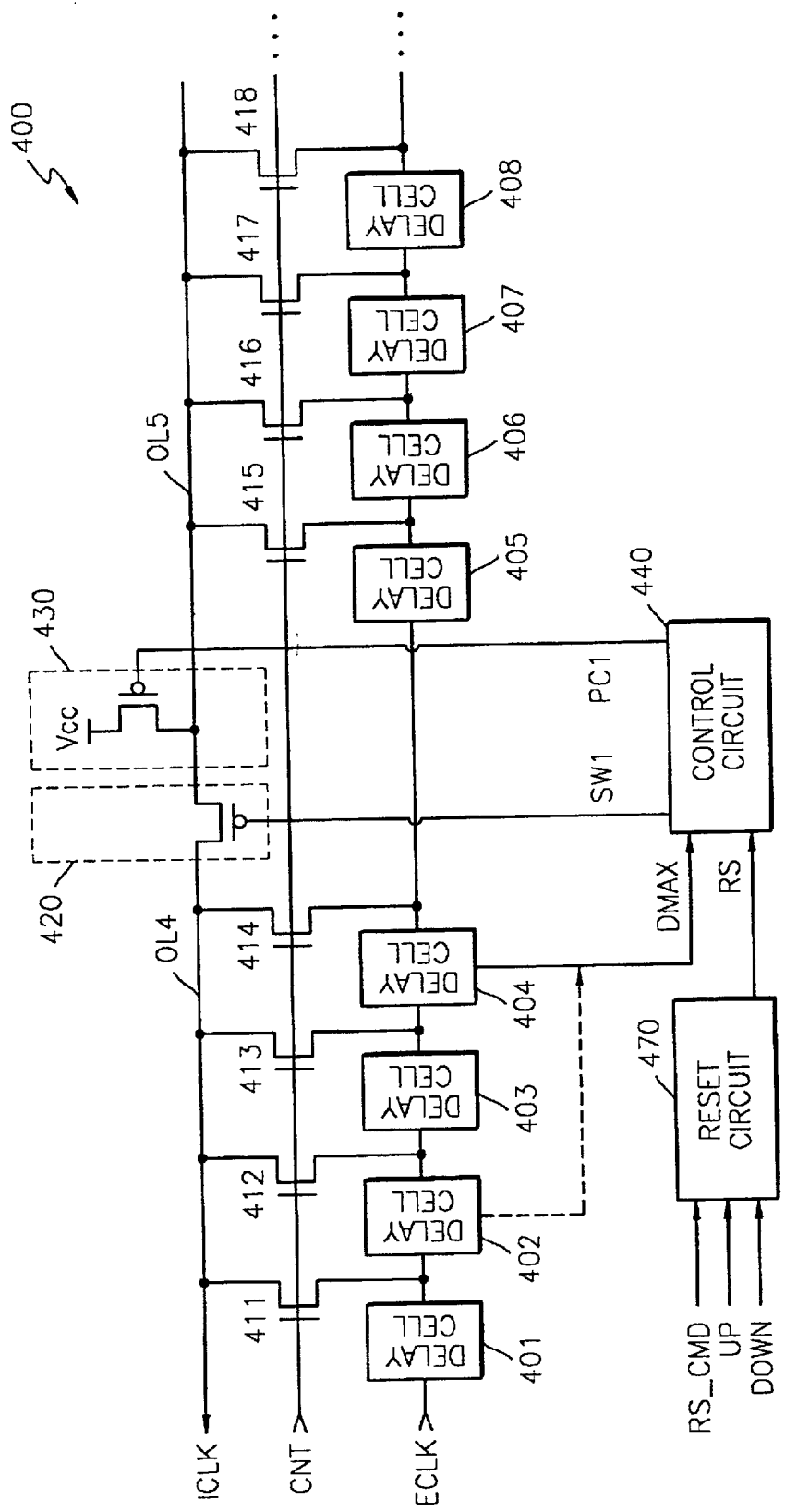
FIG. 4 is a block diagram of a variable delay unit according to another embodiment of the invention.

FIG. 4 shows a variable delay unit according to another embodiment of the invention. A variable delay unit 400 is substituted for the variable delay unit 130 of the delay locked-loop circuit shown in FIG. 1.

Referring to FIG. 4, the variable delay unit 400 comprises a first group of delay cells 401 through 404, a second group of delay cells 405 through 408, switch transistors 411 through 418, a switch 420, a precharging circuit 430, a control circuit 440, and a reset circuit 470. The precharging circuit 430, the control circuit 440, and the reset circuit 470 of the variable delay unit 400 according to this embodiment are not comprised in the variable delay unit 300 shown in FIG. 3. The delay cells 401 through 408 and the switch transistors 411 through 418 are the same as the delay cells 301 through 308 and the switch transistors 311 through 318 shown in FIG. 3 and thus, their description will be omitted.

In the case of high-frequency operation, a first output line OL4 is used, and in the case of low-frequency operation, the first output line OL4 and a second output line OL5 are used.

The switch 420 connects/disconnects the first output line OL4 and the second output line OL5 of the variable delay unit 400 in response to a switch control signal SW1. The switch 420 may comprise a PMOS transistor.

The precharging circuit 430 precharges the second output line OL5 to a power supply voltage VCC in response to a precharging signal PC1. The precharging circuit 430 may comprise a PMOS transistor, the source of which is connected to the power supply voltage VCC.

The control circuit 440 outputs the switch control signal SW1 and the precharging signal PC1 in response to a delay use signal DMAX and a reset signal RS. The delay use signal DMAX is a signal representing the use of delay time pre-designated by the delay cell 404. The reset signal RS turns the switch 420 off. In this embodiment, the delay use signal DMAX may be generated by the delay cell 402.

The reset circuit 470 outputs the reset signal RS in response to an external reset command RS_CMD, an up signal UP, and a down signal DOWN. The external reset command RS_CMD is an external signal for indicating when the switch 420 is to be turned off. The UP signal represents an increase in the number of delay cells in use. The DOWN signal represents a decrease in the number of delay cells that are operating. The UP signal and the DOWN signal may be generated by an additional control circuit (not shown).

Figure 5:
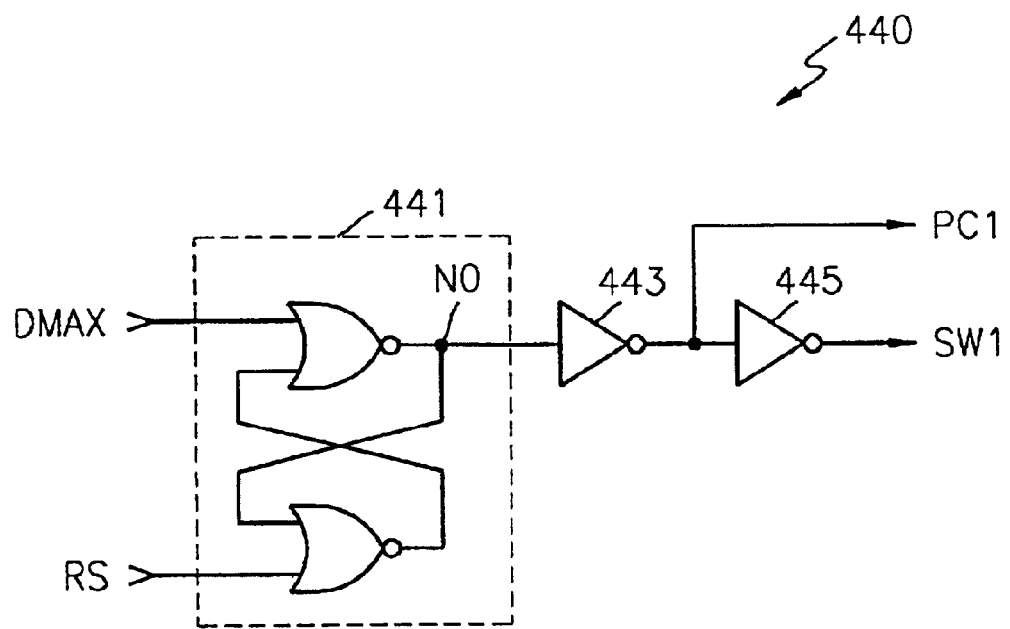
FIG. 5 is a diagram of the configuration of a control circuit shown in FIG. 4.

FIG. 5 shows an embodiment of the control circuit 440 shown in FIG. 4. The control circuit 440 comprises a latch unit 441 and inverters 443 and 445. The latch unit 441 comprises two NOR gates.

The latch unit 441 sets an output terminal NO of the latch unit 441 in response to the delay use signal DMAX and resets the output terminal NO in response to a reset signal RS. The inverter 443 inverts a signal of the output terminal NO, thereby generating a precharging signal PC1, and the inverter 445 inverts the precharging signal PC1, thereby generating a switch control signal SW1.

Figure 6:
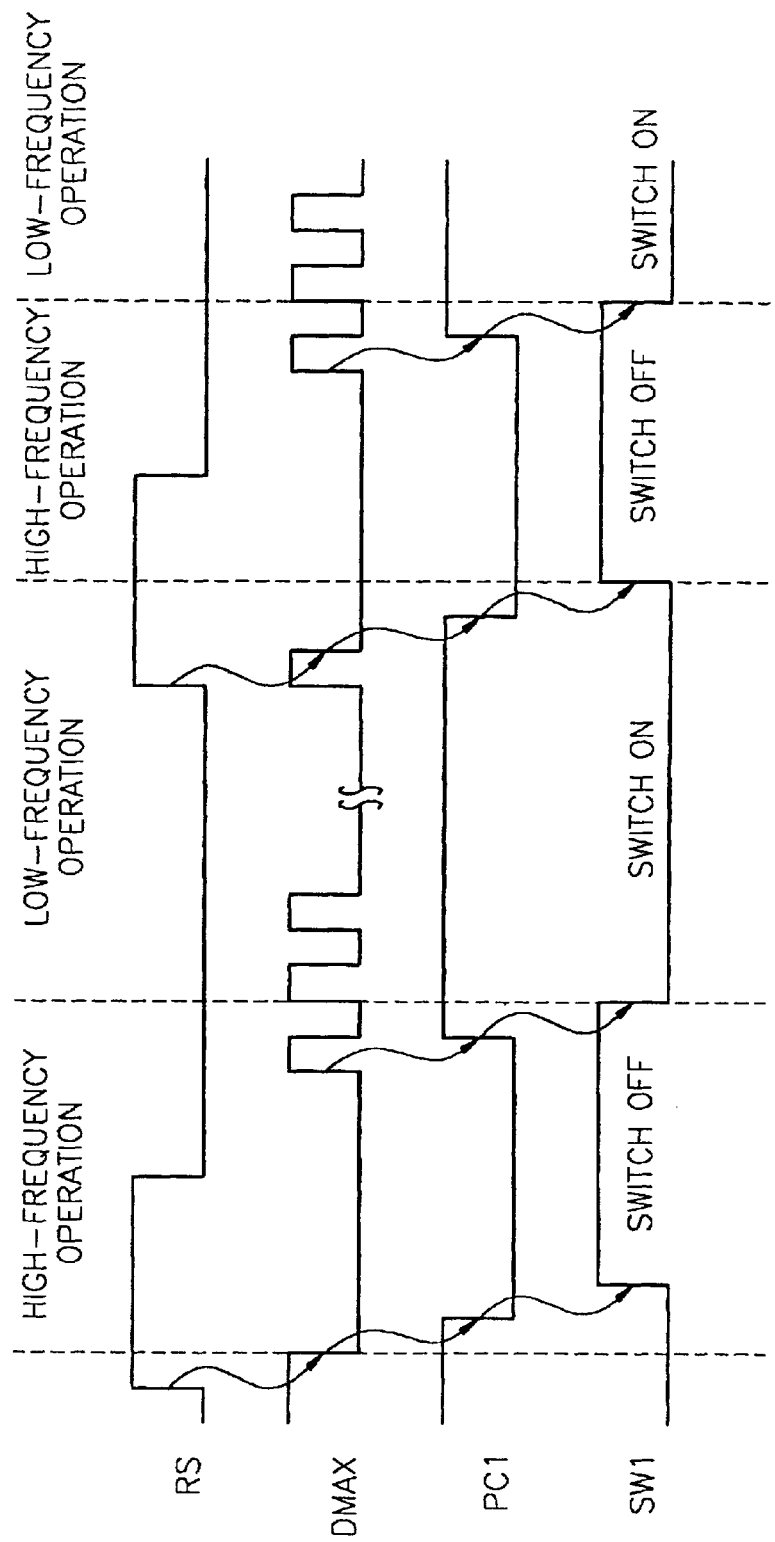
FIG. 6 is a timing diagram showing the operation of the control circuit shown in FIG. 4.

Referring to FIG. 6, there is shown a timing diagram showing the operation of the control circuit shown in FIG. 4. The timing diagram is divided into high-frequency operation sections and low-frequency operation sections. The delay use signal DMAX is inactivated when the reset signal RS is activated. Then, the precharging signal PC1 is activated and thus, precharging is performed. Also, the switch control signal SW1 is inactivated and thus, the switch 420 is turned off and high-frequency operation is performed. In other words, the delay locked-loop circuit of the invention generates an internal clock that is synchronized with an external clock having a high-frequency.

As the frequency of the external ECLK decreases, the delay cell 404 shown in FIG. 4 operates and thus, the delay use signal DMAX is activated. Then, the precharging signal PC1 is inactivated, and precharging is terminated. Also, the switch control signal SW1 is activated and thus, the switch 420 is turned on and low-frequency operation is performed.

Accordingly, the delay locked-loop circuit of the invention comprising the variable delay unit 400 stably controls the connection/disconnection of the switch 420 by the reset signal RS. As a result, low-frequency operation and high-frequency operation can alternatively repeat.

Figure 7:
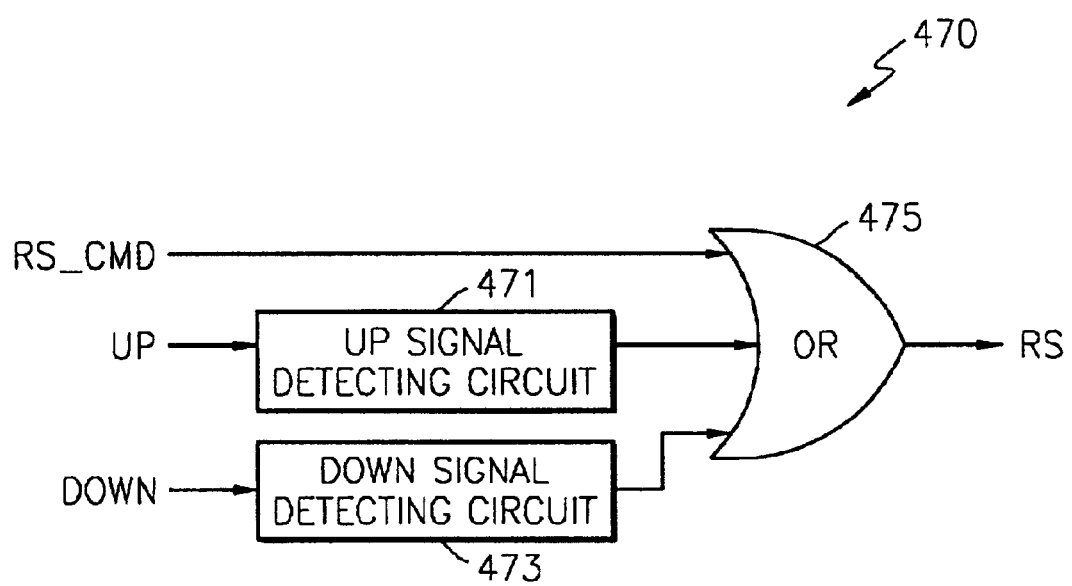
FIG. 7 is a diagram of the configuration of a reset circuit shown in FIG. 4.

FIG. 7 shows an embodiment of the reset circuit 470 of FIG. 4, wherein there is provided a UP signal detecting circuit 471, a DOWN signal detecting circuit 473, and an OR gate 475. The UP signal detecting circuit 471 and the DOWN signal detecting circuit 473 will typically comprise counters.

The UP signal detecting circuit 471 counts the number of consecutive UP signals, each representing the activation of an additional delay cell. The output is activated to a logic "high" if the counted number of UP signals exceeds a predetermined number. The DOWN detecting circuit 473 counts the number of consecutive DOWN signals, each representing a deactivation of a delay cell. The output goes "high" if the number of DOWN signals exceeds a predetermined number.

The OR circuit 475 generates a reset signal RS if either an external reset command RS_CMD, an output of the UP signal detecting circuit 471, or an output of the DOWN signal detecting circuit 473 are logic "high".

Figure 8:
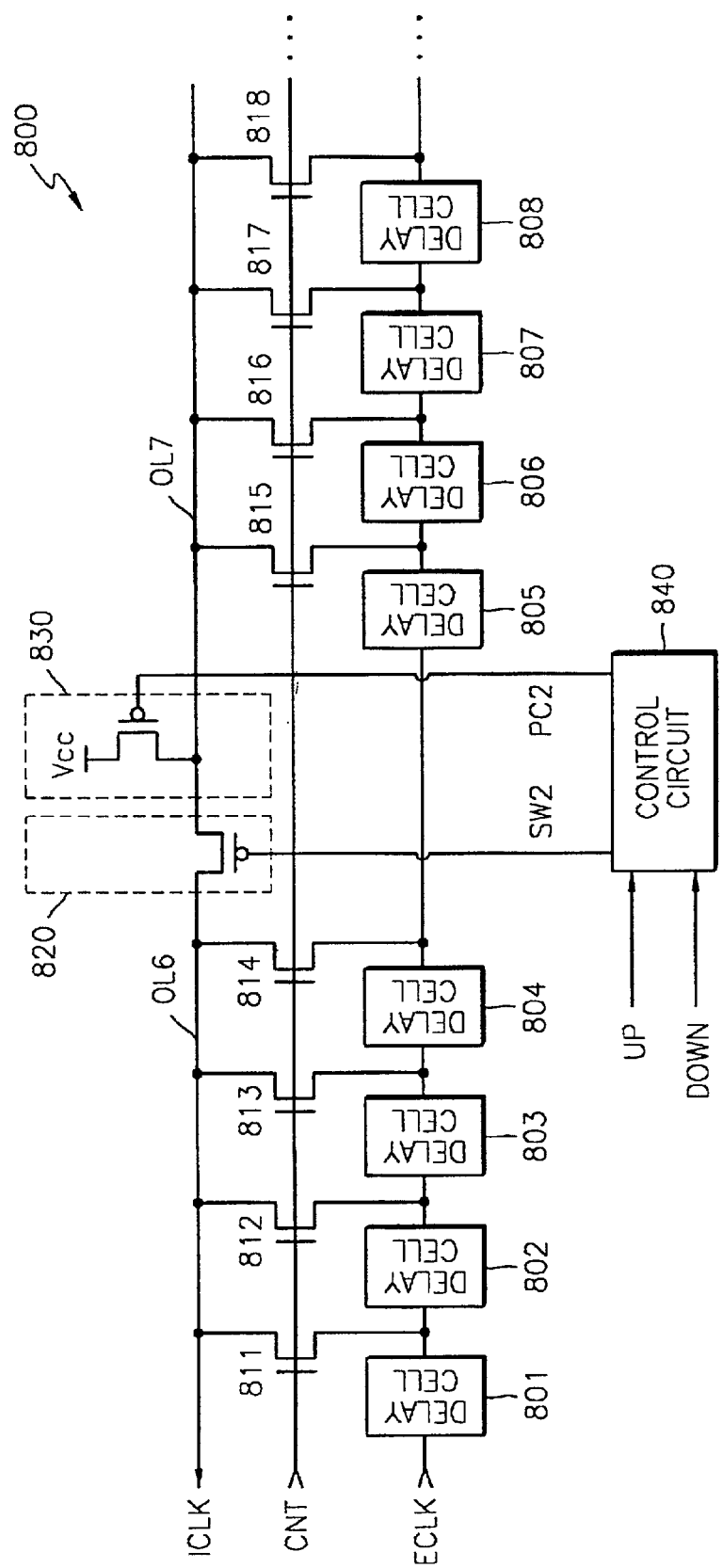
FIG. 8 is a block diagram of a variable delay unit according to another embodiment of the invention.

FIG. 8 shows a variable delay unit according to another embodiment of the invention. A variable delay unit 800 comprises a first group of delay cells 801 through 804, a second group of delay cells 805 through 808, switch transistors 811 through 818, a switch 820, a precharging circuit 830, and a control circuit 840.

In the case of high-frequency operation, a first output line OL6 is used, and in the case of low-frequency operation, the first output line OL6 and a second output line OL7 are used.

The switch 820 and the precharging circuit 830 have almost the same configuration as the switch 420 and the precharging circuit 430 shown in FIG. 4 and thus, the description of the switch 820 and the precharging circuit 830 will be omitted. The second output line OL7 is precharged to the power supply voltage VCC by the precharging circuit 830.

The control circuit 840 outputs a switch control signal SW2 that controls the turn-on/turn-off of the switch 820 and a precharging signal PC2 that controls precharging of the second output line OL7 in response to the UP signal and the DOWN signal. The UP signal represents an increase in the number of activated delay cells, and the DOWN signal represents a decrease in the number of activated delay cell, wherein the number of activated delay cells is responsive to frequency. In other words, the control circuit 840 senses variations in the frequency of an external clock ECLK and controls the switch 820 and the precharging circuit 830.

Figure 9:
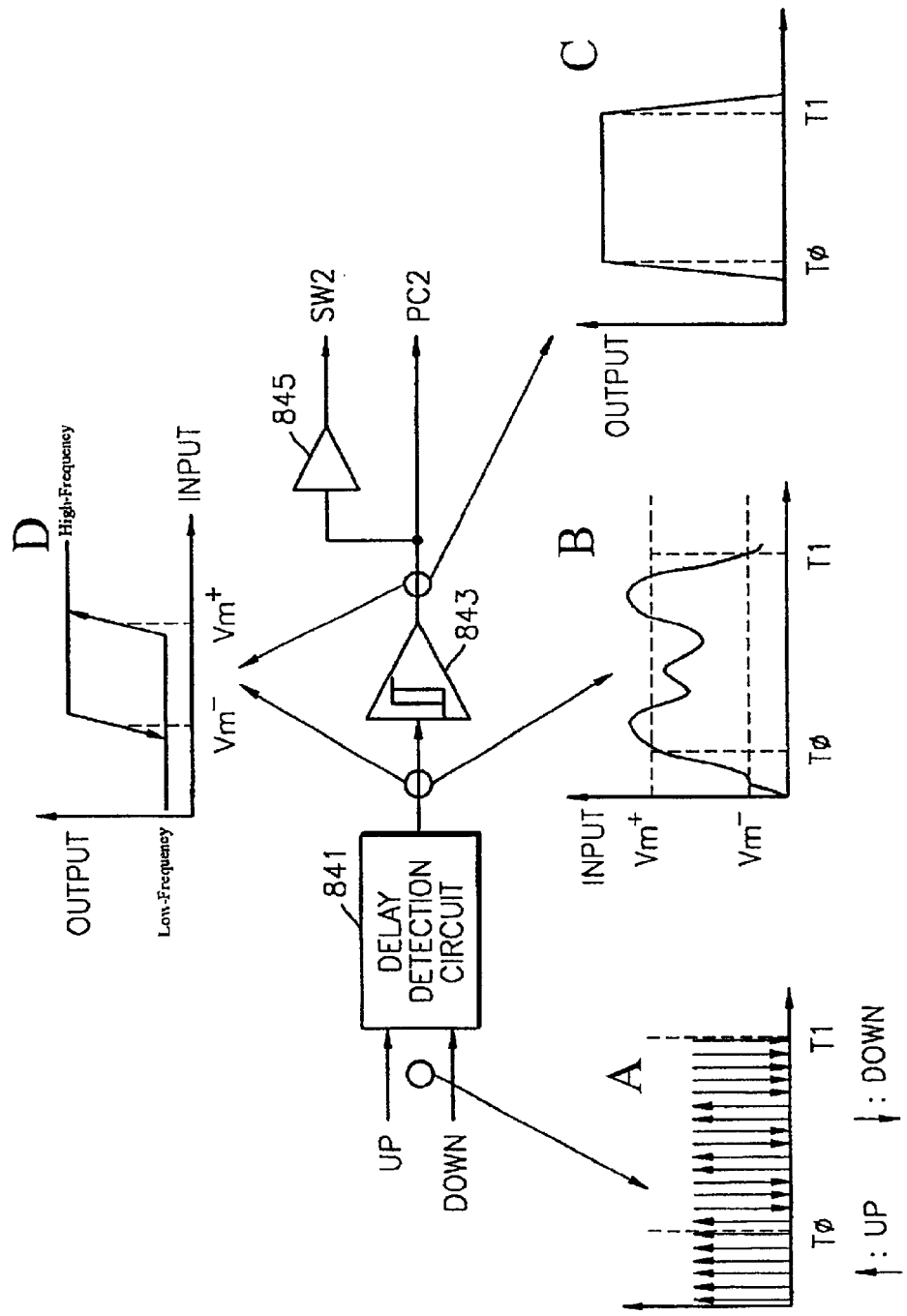
FIG. 9 is a diagram of the configuration of a control circuit shown in FIG. 8.

FIG. 9 shows an embodiment of the control circuit shown in FIG. 8, comprising a delay detection circuit 841, a Schmitt trigger buffer 843, and an inverter 845. Examples of signal waveforms A, B, and C at the input and output terminals of the delay detection circuit 841 and at an output terminal of the Schmitt trigger buffer 843 are shown.

The delay detection circuit 841 outputs a variable voltage, which is proportional to the number of the UP signals and inversely proportional to the number of the DOWN signals. The delay detection circuit 841 will preferably comprise a charge pump.

The Schmitt trigger buffer 843 outputs the variable voltage as a first voltage $Vm^+$ if the variable voltage is at or above the first voltage $Vm^+$ and outputs a second voltage $Vm^-$, which is ground voltage if the variable voltage is at or below the second voltage $Vm^-$. Voltages between the first voltage $Vm^+$ and the second voltage $Vm^-$ are hysteresis voltages, and delay variations in hysteresis voltages are neglected. The first voltage $Vm^+$ is set to a critical voltage representing the change from high-frequency operation to low-frequency operation, and the second voltage $Vm^-$ is set to a critical voltage representing the change from low-frequency operation to high-frequency operation.

Schmitt trigger buffer 843 outputs a precharging signal PC2. The inverter 845 inverts the precharging signal PC2 into a switching signal SW2.

Referring to graphs B and C showing the waveforms at the input and output terminals of the Schmitt trigger buffer 843, the signal output from the Schmitt trigger buffer 843 is logic "low" until time T0 and thus, the switch 820 is turned off and the second output line OL7 is precharged. Here, high-frequency operation is performed. The signal output from the Schmitt trigger buffer 843 is logic "high" from time T0 to time T1 and thus, the switch 820 is turned on and precharging of the second output line OL7 is terminated. Here, a low-frequency operation is performed. The signal output from the Schmitt trigger buffer 843 drops to logic "low" after time T1 and thus, high-frequency operation is performed again. The relationship between the input and output voltages of the Schmitt trigger is shown in graph D, which shows the output voltages to be stable between $Vm^+$ and $Vm^-$ at both high and low frequency operation.

Accordingly, the delay locked-loop circuit of the invention comprising the variable delay unit 800 neglects delay variations in the hysteresis voltage so as to stably perform the turn-on/turn-off of the switch. Thus, the delay locked-loop circuit of the invention stably operates at high frequency and low frequency even if the frequency of an external clock alternately changes between high frequency and low frequency.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A delay locked-loop circuit comprising:
   a phase detector for detecting a phase difference between an external clock signal and an internal clock signal;
   a delay unit controller for generating a control signal in response to output of the phase detector; and
   a variable delay unit for delaying the external clock in response to the control signal to synchronize the internal clock with the external clock, the variable delay unit comprising:
   a first group of delay cells used at or above a predetermined frequency;
   a second group of delay cells used with the first group of delay cells below the predetermined frequency;
   switch transistors for connecting/disconnecting the first group of delay cells and the second group of delay cells to/from a first output line and a second output line of the variable delay unit, respectively, in response to the control signal; and
   a switch for connecting/disconnecting the first output line to/from the second output line in response to a delay use signal representing the use of one of the delay cells in the first group, wherein the delay use signal is a signal representing either the use of a last delay cell in the first group of delay cells or one of the remaining delay cells except the last delay cell.

2. The delay locked-loop circuit of claim 1, wherein the delay use signal is a signal representing the use of a delay cell that is disposed immediately before the switch.

3. A delay locked-loop circuit comprising:
   a phase detector for detecting a phase difference between an external clock and an internal clock;
   a delay unit controller for generating a control signal in response to output of the phase detector; and
   a variable delay unit for delaying the external clock in response to the control signal to synchronize the internal clock with the external clock, the variable delay unit comprising:
   a first group of delay cells used at or above a predetermined frequency;
   a second group of delay cells used with the first group of delay cells below the predetermined frequency;
   switch transistors for connecting/disconnecting the first group of delay cells and the second group of delay cells to/from a first output line and a second output line of the variable delay unit, respectively, in response to the control signal;
   a switch for connecting/disconnecting the first output line to/from the second output line, wherein the delay use signal is a signal representing either the use of a last delay cell in the first group of delay cells or one of the remaining delay cells except the last delay cell; and
   a control circuit for controlling the turn-on/turn-off of the switch in response to a delay use signal representing the use of one of the delay cells in the first group and a reset signal.

4. The delay locked-loop circuit of claim 3, wherein the variable delay unit further comprises a reset circuit for generating the reset signal in response to an external reset command, an UP signal representing an increase in the number of the delay cells used, or a DOWN signal representing a decrease in the number of the delay cells used.

5. The delay locked-loop circuit of claim 3, wherein the variable delay unit further comprises a precharging circuit for precharging the second output line to a predetermined voltage level in response to a precharging signal output from the control circuit.

6. The delay locked-loop circuit of claim 3, wherein the control circuit comprises:
   a latch unit for setting an output terminal in response to the delay use signal and resetting the output terminal in response to the reset signal; and
   a buffer for generating a switch control signal to control the switch.

7. The delay locked-loop circuit of claim 4, wherein the reset circuit comprises:
   an UP signal detecting circuit for counting the number of consecutive UP signals and activating output of the reset circuit if the counted number of consecutive UP signals is at or above a predetermined value;
   a DOWN signal detecting circuit for counting the number of consecutive DOWN signals and activate output of the reset circuit if the counted number of consecutive DOWN signals is at or above a predetermined value; and
   an OR circuit for generating the reset signal in response to the external reset command, output of the UP signal detecting circuit, or output of the DOWN signal detecting circuit.

8. The delay locked-loop circuit of claim 7, wherein the UP signal detecting circuit and the DOWN signal detecting circuit each comprise a counter.

9. The delay locked-loop circuit of claim 5, wherein the precharging circuit comprises a PMOS transistor.

10. The delay locked-loop circuit of claim 3, wherein the switch comprises a PMOS transistor.

11. A delay locked-loop circuit comprising:
    a phase detector for detecting a phase difference between an external clock and internal clock;
    a delay unit controller for generating a control signal in response to output of the phase detector; and
    a variable delay unit for delaying the external clock in response to the control signal to synchronize the internal clock with the external clock, the variable delay unit comprising:
    a first group of delay cells used at or above a predetermined frequency;
    a second group of delay cells used with the first group of delay cells below the predetermined frequency;
    switch transistors for connecting/disconnecting the first group of delay cells and the second group of delay cells to/from a first output line and a second output line of the variable delay unit, respectively, in response to the control signal;
    a switch for connecting/disconnecting the first output line to/from the second output line, wherein the second group of delay cells are used with either the use of a last delay cell in the first group of delay cells or at least one of the remaining delay cells except the last delay cell; and
    a control circuit for controlling the turn-on/turn-off of the switch in response to delay variation signals representing variations in the number of delay cells used.

12. The delay locked-loop circuit of claim 11, wherein the variable delay unit further comprises a precharging circuit for precharging the second output line to a predetermined voltage level in response to a precharging signal output from the control circuit.

13. The delay locked-loop circuit of claim 11, wherein the control circuit comprises:

a delay detection circuit for generating a variable voltage in response to an UP signal of the delay variation signals representing an increase in the number of the delay cells used, and in response to a DOWN signal of the delay variation signals representing a decrease in the number of the delay cells used;

a Schmitt trigger buffer for outputting the variable voltage as a first voltage if the variable voltage is at or above a first voltage level and as ground voltage if the variable voltage is at or below a second voltage, so as to generate the precharging signal; and an inverter for inverting the precharging signal to generate a switch control signal to control the switch.

14. The delay locked-loop circuit of claim 12, wherein the precharging circuit comprises a PMOS transistor.

15. The delay locked-loop circuit of claim 13, wherein the delay detection circuit comprises a charge pump.

16. The delay locked-loop circuit of claim 13, wherein the switch comprises a PMOS transistor.

17. A delay locked-loop circuit comprising:

a phase detector for detecting a phase difference between an external clock signal and an internal clock signal;

a delay controller for generating a control signal in response to output of the phase detector; and a variable delay for delaying the external clock in response to the control signal to synchronize the internal clock with the external clock, the variable delay having a first and second output lines; and means for connecting/disconnecting a first group of delay cells used at or above a predetermined frequency and a second group of delay cells used with the first group of delay cells below the frequency to/from the first output line and the second output line, respectively, in response to the control signal, wherein the second group of delay cells are used with the use of at least one of the delay cells in the first group.

18. The delay locked-loop circuit of claim 17, further comprising second switch means for connecting/disconnecting the first output line to/from the second output line in response to a delay use signal representing the use of one of the delay cell means in the first group.

* * * * *